United States Patent
Kumar et al.

(10) Patent No.: US 6,767,832 B1
(45) Date of Patent: Jul. 27, 2004

(54) IN SITU LINER BARRIER

(75) Inventors: Kiran Kumar, Sunnyvale, CA (US); Zhihai Wang, Sunnyvale, CA (US); Wilbur G. Catabay, Saratoga, CA (US); Kai Zhang, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 496 days.

(21) Appl. No.: 09/844,352

(22) Filed: Apr. 27, 2001

(51) Int. Cl.[7] .................. H01L 21/302; H01L 21/3065
(52) U.S. Cl. .................. 438/689; 438/700; 438/706; 438/710; 438/712
(58) Field of Search ............... 438/689, 700, 438/706, 710, 712

(56) References Cited

U.S. PATENT DOCUMENTS

| | | | |
|---|---|---|---|
| 5,043,300 A | 8/1991 | Nulman | 437/200 |
| 5,236,868 A | 8/1993 | Nulman | 437/190 |
| 5,880,500 A | * 3/1999 | Iwata et al. | 257/336 |
| 5,972,179 A | * 10/1999 | Chittipeddi et al. | 204/192.17 |
| 6,077,781 A | * 6/2000 | Guo et al. | 438/688 |

* cited by examiner

Primary Examiner—Nadine G. Norton
Assistant Examiner—Lynette T. Umez-Eronini
(74) Attorney, Agent, or Firm—Luedeka, Neely & Graham

(57) ABSTRACT

A method of processing a substrate, where the substrate is transferred from an ambient environment into a clean environment. The substrate is heated to at least a first temperature within the clean environment, and then maintained at no less than the first temperature within the clean environment. The substrate is selectively transferred within the clean environment to more than one processing chambers, and processed in the more than one processing chambers. The substrate is transferred from the clean environment into the ambient environment.

6 Claims, 2 Drawing Sheets

IN SITU LINER BARRIER

FIELD

This invention relates to the field of integrated circuit fabrication. More particularly, this invention relates to a process of performing contaminant sensitive structures on a substrate.

BACKGROUND

A variety of different materials are typically used in integrated circuit fabrication processes. Many of these materials are highly susceptible to various contaminants. In addition, some processes, at intermediate points, create sites or structures that are very susceptible to contamition. For example, when trenches or holes are etched into dielectric films, the dielectric films tend to be extremely susceptible to contaminants in the atmosphere such as oxygen, nitrogen, rare gases, hydrocarbons, water vapor and other atmospheric contaminants. When exposed to such, the etched portions of the dielectric layer tend to attract such contaminants and can subsequently release the contaminants, such as by outgassing, which tends to have adverse affects on the subsequent processing of the substrate.

In the specific case of low dielectric constant materials, which tend to be porous in nature, the adsorption of contaminants tends to be even greater. Thus, when a low dielectric constant material is etched, the etched portions tend to adsorb contaminants. Then, when a thin material layer is subsequently deposited over the etched portions, such as when a diffusion barrier is formed in a via, the contaminants absorbed in the low dielectric constant material in the area of the etched via tend to outgas and interfere with the uniform and desirable deposition of the deposited layer. This condition tends to cause problems with the integrated circuit, such as barrier layers that are porous or otherwise defective, and which do not exhibit the desired barrier properties.

As a more specific example, when a titanium adhesion layer is deposited in an etched low dielectric constant via, and then the titanium adhesion layer is followed by a titanium nitride diffusion barrier layer, and then the titanium nitride diffusion barrier layer is followed by a tungsten plug deposition, the tungsten plug deposition tends to not fill properly due to moisture absorption and subsequent outgassing by the intermediate layers.

What is needed, therefore, is a method of forming structures on a substrate where the substrate and the various layers are processed in a manner that substantially inhibits moisture absorption and undesired outgassing.

SUMMARY

The above and other needs are met by a method of processing a substrate, where the substrate is transferred from an ambient environment into a clean environment. The substrate is heated to at least a first temperature within the clean environment, and then maintained at no less than the first temperature within the clean environment. The substrate is selectively transferred within the clean environment to more than one processing chambers, and processed in the more than one processing chambers. The substrate is transferred from the clean environment into the ambient environment.

By maintaining the temperature of the substrate to at least the first temperature during processing of the substrate within the clean environment, the substrate tends to absorb a reduced amount of contaminants, such as moisture. Thus, because a reduced amount of contaminants such as moisture are adsorbed, there is a commensurately reduced amount of undesirable outgassing from the substrate. Therefore, the layers deposited on the substrate tend to exhibit improved characteristics, such as adhesion.

In various preferred embodiments of the invention, the step of maintaining the substrate at no less than the first temperature within the clean environment is accomplished in different ways. In one embodiment all of the clean environment is heated to at least the first temperature. In another embodiment the substrate is transferred and processed quickly through the more than one processing chambers within the clean environment so that the substrate does not have time to cool below the first temperature. In a third embodiment the substrate is heated to at least the first temperature within each of the more than one processing chambers, and the substrate is transferred quickly between the more than one processing chambers within the clean environment so that the substrate does not have time to cool below the first temperature between the more than one processing chambers.

The first temperature is preferably at least about 150 centigrade, and most preferably between about 150 centigrade and about 350 centigrade. Preferably the pressure within the clean environment is reduced to a base pressure of between about $10^{-7}$ torr and about $10^{-9}$ torr. Most preferably the pressure within the more than one processing chambers is selectively adjusted while processing the substrate in the more than one processing chambers.

In a most preferred embodiment the step of processing the substrate in the more than one processing chambers includes heating the substrate under a vacuum in a degassing chamber, etching the substrate in an etch chamber, depositing a layer of titanium in a first deposition chamber, and depositing a layer of titanium nitride in a second deposition chamber.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
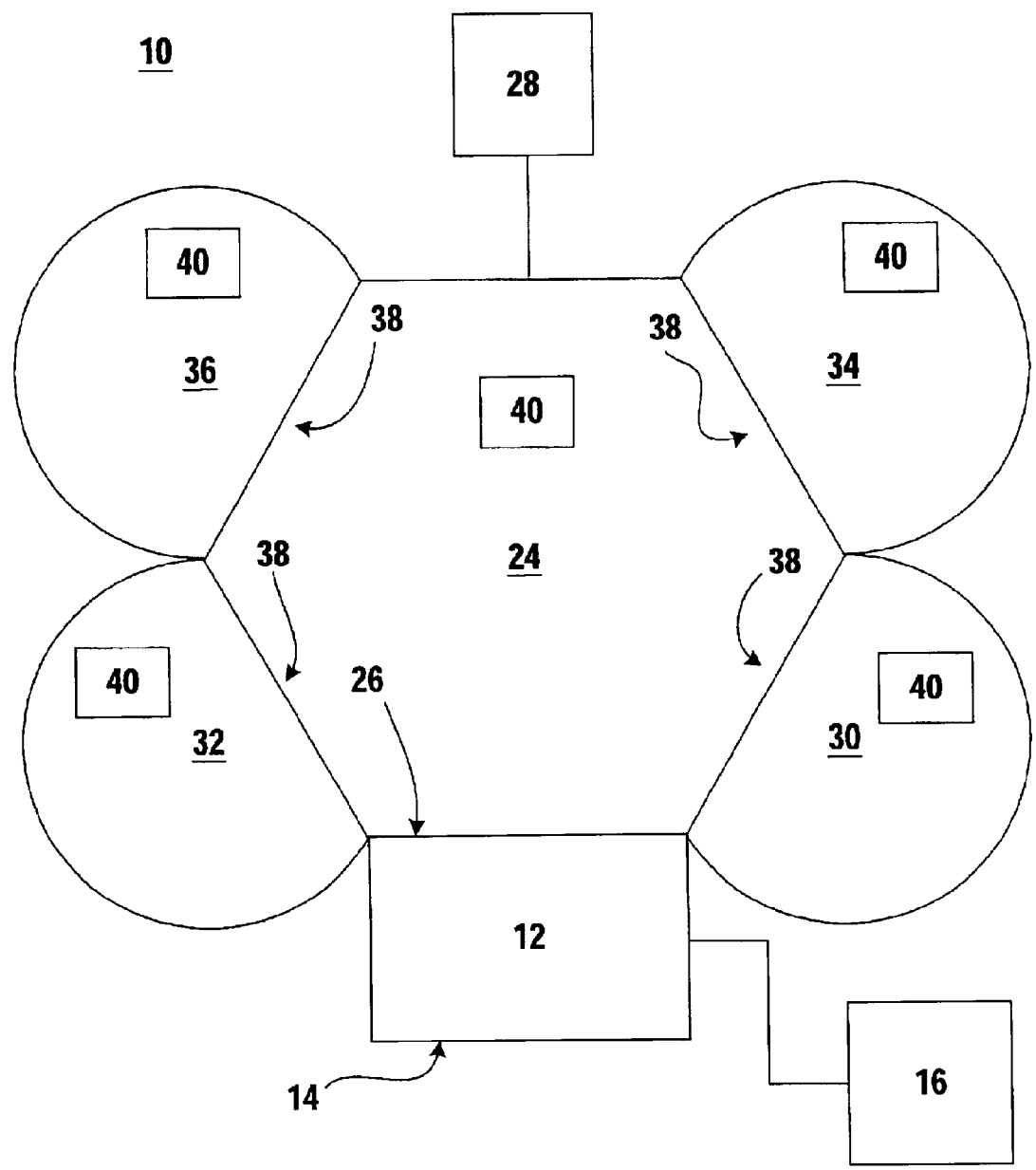
FIG. 1 is a functional block diagram of an apparatus for processing a substrate in accordance with the invention.

Referring now to FIG. 1, there is depicted a functional block diagram of an apparatus 10 for performing contaminant sensitive processing on a substrate, in accordance with the invention. The apparatus 10 is most preferably a cluster tool, such as an Endura 5500 cluster tool platform, as manufactured by Applied Materials, Inc. of Santa Clara, Calif. The ambient environment outside of the apparatus 10 is normally relatively contaminant laden, even though the ambient environment is typically that of a clean room. The apparatus 10 is operable to create a clean environment throughout at least the processing chambers and transfer areas within the apparatus 10.

The apparatus 10 preferably includes a load chamber 12, wherein the substrate is initially isolated from the outside ambient environment. A first load lock 14 selectively isolates the interior of the load chamber 12 from the outside environment. A first pumping system 16 draws a vacuum on the load chamber 12, once the first load lock mechanism 14 is closed.

A transfer chamber 24 is located adjacent the load chamber 12. A second load lock 26 selectively isolates the load chamber 12 from the transfer chamber 24. When the first pumping system 16 has drawn a vacuum of desired degree on the load chamber 12, the second load lock 26 preferably opens and the substrate is transferred into the transfer chamber 24. Upon such transfer of the substrate into the transfer chamber 24, the second load lock 26 preferably closes, isolating the transfer chamber 24 from the load chamber 12.

The transfer chamber 24 preferably connects to a number of processing chambers for selectively processing the substrate. The processing chambers are preferably selectively and independently isolated from the transfer chamber 24 by load locks 38. Once the second load lock mechanism 26 is closed, a second pumping system 28 preferably draws a higher vacuum on the transfer chamber 24 than that which was drawn on the load chamber 12. Most preferably the vacuum is drawn to a pressure of between about $10^{-7}$ torr and $10^{-9}$ torr. Thus, the environment within the transfer chamber 24 and the processing chambers 30, 32, 34, and 36 constitute the clean environment. The environment with the load chamber 12 may also be included within the clean environment, in certain embodiments.

In a most preferred embodiment of the invention, the apparatus 10 includes a degassing chamber 30, etch chamber 32, first deposition chamber 34, and second deposition chamber 36 for selectively processing the substrate. It is appreciated that the exact configuration of the processing system 10 may differ from that as depicted in FIG. 1. However, it is also appreciated that the processing system 10 as described herein is specified according to its functions and is not limited to the physical embodiment as given in FIG. 1. It is further appreciated that the number and type of processing chambers may be either greater than or less than the number depicted in FIG. 1 and described in the embodiments below.

The degassing chamber 30, etch chamber 32, first deposition chamber 34, and second deposition chamber 36 are, in one embodiment, connected to the second pumping system 28. Alternately, one or all of the processing chambers 30, 32, 34, and 26 have their own independent vacuum pumping systems to provide for vacuum conditions as desired in each of the processing chambers. Most preferably, and regardless of whether a common vacuum pumping system is shared or each chamber 24, 30, 32, 34, and 36 has its own independent vacuum pumping system, the various chambers can be selectively isolated one from another and the pressure within the chambers can be selectively adjusted independently of one another.

In a preferred embodiment, the transfer chamber 24, degassing chamber 30, etch chamber 32, first deposition chamber 34 and second deposition chamber 36 each contain a heater 40 that is operable to maintain a desired minimum temperature of the substrate while the substrate is disposed within each chamber. For example, the heaters 40 may be heat lamps or resistive heaters, or a combination of these or other types of heaters that are compatible with the environment processes and materials as described herein.

In an alternate embodiment, a heated platen is used in the transfer chamber 24 to transfer the substrate from one processing chamber to the next. In yet another embodiment, a single heat source is used to heat the transfer chamber 24, degassing chamber 30, etch chamber 32, first deposition chamber 34 and second deposition chamber 36. In a further embodiment, heaters 40 are only found as necessary within one or more of the processing chambers 30, 32, 34, and 36. The importance of heat during processing is described in more detail below.

As mentioned above, there are many processes that are extremely sensitive to contamination at various intermediate points of the processes. The apparatus 10 as described above may be used according to a specified method to perform such processes in a manner that the sensitive intermediate structures produced by the processes are not unduly exposed to contamination, at least not in a manner that the contamination unduly impacts the formation or function of the intermediate structures.

One aspect of such a preferred method is to maintain the clean environment within the apparatus 10 from a point in the processing of the substrate that is before such sensitive structures are formed until a point in the processing of the substrate that is after such sensitive structures are adequately protected, such as by overlying structures. Another aspect of the preferred method is to maintain the substrate at no less than a minimum temperature during the sensitive processing of the substrate, so that contaminants that may yet be found in the clean environment are less likely to be adsorbed by the substrate. In this manner, the heated substrate tends to outgas whatever degree of contaminants the sensitive structures thereon may have already adsorbed, while tending to resist the adsorption of additional contaminants. Yet another aspect of the preferred method according to the present invention is to reduce the amount of staging time between such sensitive process steps, so that the sensitive structures created by the processing steps do not have an unduly long period of time in which to adsorb contaminants. By combining these aspects of the invention in various combinations, very sensitive structures can be created and then protected in a manner in which they are not unduly contaminated, and tend to ultimately function at a higher level.

Figure 2:
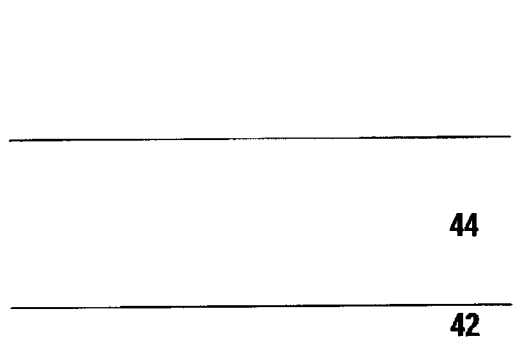
FIG. 2 is cross-sectional diagram of a substrate, including first and second layers.

Having described the structure of the apparatus 10 and some of the improvements to its operation as given above, a more detailed substrate processing procedure is now described by way of example, with additional reference to FIGS. 2–6. FIG. 2 depicts a substrate having two layers, 42 and 44. Layer 42, in this example, is preferably an electrically conductive layer, such as a bottom metal layer. Layer 44 is preferably an electrically insulating layer, such as a silicon oxide dielectric layer. FIGS. 2–6 generally depict the various stages of processing in forming a via 46 in the dielectric layer 44, and then creating a liner barrier system within the via 46. For low k dielectric layers 44, this process sequence is one that is typically very susceptible to contamination, which tends to create problems such as a high via resistance to the electrically conductive layer 42. Thus, a method according to the present invention, such as described below, is particularly applicable to such a process sequence.

The substrate is brought within the transfer chamber 24 according to the method as described above. With the substrate inside the transfer chamber 24 and protected from the ambient environment, the substrate may now be selectively transferred into and out of various processing chambers.

As mentioned above, it is preferred that the substrate be processed at a minimum temperature. This can be accomplished according to any combination of one or more of the methods as disclosed above. Most preferably, the minimum temperature is between about 150 centigrade and about 350 centigrade.

It is also preferred that the substrate be processed in a continual and uninterrupted manner from one processing chamber to the next, as described below. That is, the substrate is transferred from one chamber to the next without substantial delay. Correspondingly, because the substrate is continuously heated during the processing thereof, the substrate adsorbs fewer impurities to contaminate the substrate and outgas into the deposited films. By containing fewer impurities, the electrical properties of the processed substrate tend to be more predictable. Further, by transferring the substrate without substantial delay between the processing chambers, the substrate retains cleaner interfaces between various deposition layers.

The substrate is transferred from the transfer chamber 24 to the degassing chamber 30. Once inside the degassing chamber 30, the substrate is heated to the minimum temperature of between about 150 centigrade and about 350 centigrade for a time period of between about ten seconds and about ninety seconds. The exact time and temperature for the degas process is dependent upon the substrate materials and the preferred amount of degassing desired.

Figure 3:
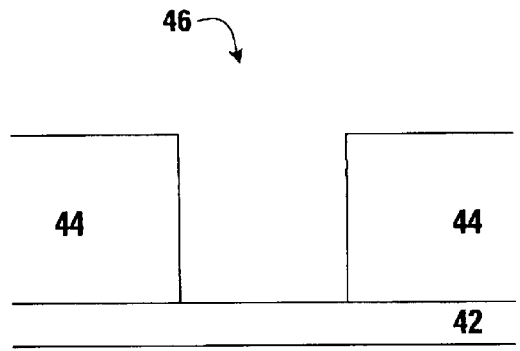
FIG. 3 is a cross-sectional diagram of a via etched in a layer of the substrate.

The substrate is then transferred without substantial delay to the etch chamber 32. Once inside the etch chamber 32, the second layer 44 of the substrate is etched to form a via 46 within the second layer 44, as depicted in FIG. 3. Preferably, the via 46 extends completely through the second layer 44 to the first layer 42. In various embodiments, the etching step is accomplished by one or more of a sputter etching process or a reactive-ion etching process. Most preferably the etch is accomplished in steps, such as a first etch step in carbon monoxide, a second etch step in oxygen, a nitrogen plasma densification, and an oxygen reactive ion etch clean. Preferred operating parameters include a plasma power of between about 150 watts and about 550 watts, a pedestal power of between about 150 watts and about 550 watts, and a direct current bias of between about −100 volts and about −700 volts, for a period of time to achieve an etch of about fifty to three hundred angstroms, depending upon the thickness of the second layer 44.

Figure 4:
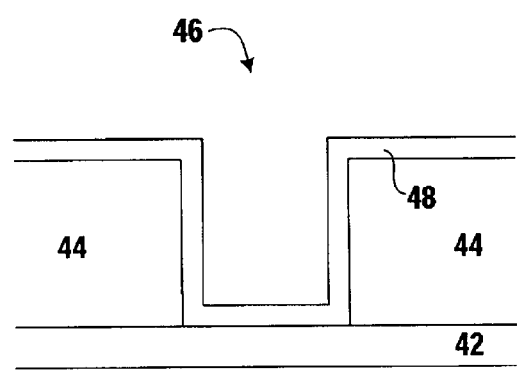
FIG. 4 is a cross-sectional diagram of an adhesion layer deposited in the via of the substrate.

Once the via 46 is etched according to the preferred etching process, the substrate is transferred without substantial delay to the first deposition chamber 34. Once inside the first deposition chamber 34, a layer of a titanium is preferably deposited over the clean etched surfaces of the via 46, forming an adhesion and gettering layer 48 as depicted in FIG. 4. The titanium layer 48 may be deposited by either a physical vapor deposition process or a chemical vapor deposition process. This tends to be a very critical process sequence, as both the freshly etched surfaces of the second layer 44, being the sidewalls of the via 46, and the titanium adhesion layer 48 tend to be extremely susceptible to contamination. Thus, the process sequence under the constraints as described above tends to reduce the amount of contamination adsorbed by both the sidewalls of the via 46 and the titanium adhesion layer 48.

Figure 5:
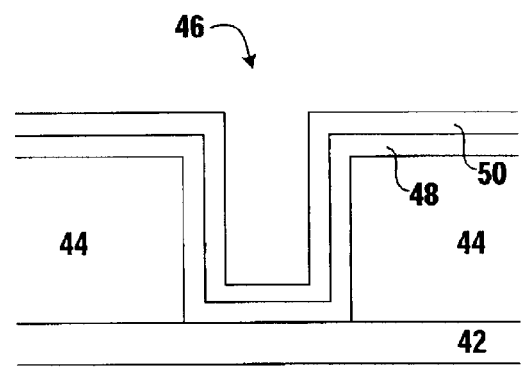
FIG. 5 is a cross-sectional diagram of a barrier layer deposited in the via of the substrate.

Once the adhesion layer 48 is formed, the substrate is transferred without substantial delay to the second deposition chamber 36. Once inside the second deposition chamber 36, the temperature of the substrate is preferably adjusted to between about 300 centigrade and about 400 centigrade. Subsequently, an additional layer, such as a barrier layer 50 of titanium nitride, is preferably deposited over the adhesion layer 48 as depicted in FIG. 5. The titanium nitride layer 50 may be deposited by either a physical vapor deposition process or most preferably an in-situ chemical vapor deposition process.

When deposited by chemical vapor deposition, the substrate is preferably allowed to sit for about thirty seconds to about sixty seconds in a neutral ambient at a pressure of about $10^{-3}$ torr while it heats to a temperature of between about 300 centigrade and about 400 centigrade. This step is preferably performed prior to actual introduction of the reactive gases into the second deposition chamber 36, and allows the substrate to reach equilibrium and allow any outgassing to proceed to substantial completion before deposition of the titanium nitride barrier layer 50 begins.

The titanium nitride barrier layer 50 is preferably relatively inert and not unduly susceptible to contaminants. Therefore, once the barrier layer 50 is formed, the etched via 46 and the titanium adhesion layer 48 are fairly well protected from contamination. Thus, after deposition of the titanium nitride barrier layer 50, the substrate may be removed from the apparatus 10.

Figure 6:
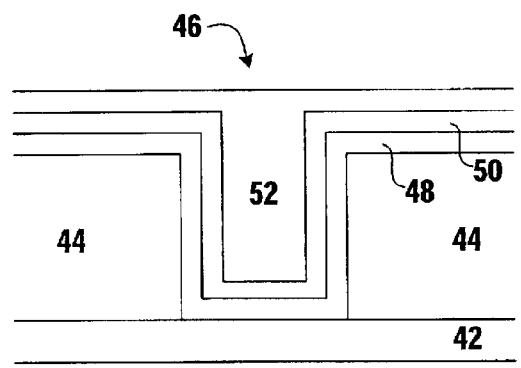
FIG. 6 is a cross-sectional diagram of a plug layer deposited in the via of the substrate.

The present invention can be applied to process integration for low k dielectrics in general, such as when they are used as inter level dielectrics for multi layer interconnects in integrated circuit fabrication. Most preferably, a plug layer 52 such as tungsten, such as deposited in a subtractive tungsten fill, or copper, such as deposited as part of a damascene copper fill, is deposited over the barrier layer 50 to complete the formation of the electrical interconnect portion of the via 46, as depicted in FIG. 6. The deposition of the plug layer 52 may be accomplished in a separate apparatus or in a fifth processing chamber of the apparatus 10.

Thus, heating the substrate from the degas process onwards, and maintaining this temperature through deposition of the titanium nitride layer 50, where the temperature of the substrate is adjusted, tends to protect the intermediate structures that are formed as described above. This benefit is preferably enhanced by the quick succession of processes from degas through titanium nitride deposition, achieved be executing all the processes continuously and sequentially in the same high vacuum environment. Base pressure in the apparatus 10 is preferably maintained in the range of about $10^{-7}$ torr to about $10^{-9}$ torr. Individual processing chambers are preferably maintained at this range for degas, sputter, and physical vapor deposition processes, and at a pressure of about $10^{-3}$ torr for chemical vapor deposition processes. This lack of vacuum break between the layers enable conformal deposition of liner layer 48 and the barrier layer 50 without excessive moisture absorption and outgassing.

It is appreciated that the number of process steps performed within the apparatus 10, the materials described in the specific examples above, and the types of process steps so described are all by way of example only. In various embodiments, different numbers and types of process steps may be performed within the apparatus 10.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of processing a substrate, the method comprising the sequential steps of:

transferring the substrate from an ambient environment into a clean environment, heating the substrate to at least a first temperature of between about one hundred and fifty centigrade and about three hundred and fifty centigrade within the clean environment, maintaining the substrate at no less than the first temperature within the clean environment, selectively transferring the substrate within the clean environment to more than one processing chambers, and processing the substrate in the more than one processing chambers by, performing an initial heating of the substrate in a degassing chamber, etching the substrate in an etch chamber to form a via, depositing a layer of titanium within the via in a first deposition chamber, and depositing a layer of titanium nitride over the layer of titanium in a second deposition chamber, and transferring the substrate from the clean environment into the ambient environment.

2. The method of claim 1 wherein the step of maintaining the substrate at no less than the first temperature within the clean environment comprises heating all of the clean environment to at least the first temperature.

3. The method of claim 1 wherein the step of maintaining the substrate at no less than the first temperature within the clean environment comprises transferring and processing the substrate quickly through the more than one processing chambers within the clean environment so that the substrate does not have time to cool below the first temperature.

4. The method of claim 1 wherein the step of maintaining the substrate at no less than the first temperature within the clean environment comprises heating the substrate to at least the first temperature within each of the more than one processing chambers, and transferring the substrate quickly between the more than one processing chambers within the clean environment so that the substrate does not have time to cool below the first temperature between the more than one processing chambers.

5. The method of claim 1 further comprising the steps of reducing a pressure within the clean environment to a base pressure of between about $10^{-7}$ torr and about $10^{-9}$ torr.

6. The method of claim 1 wherein the step of processing the substrate in the more than one processing chambers further comprises selectively adjusting a pressure within the more than one processing chambers while processing the substrate in the more than one processing chambers.

* * * * *